(12) United States Patent
Kobayashi

(10) Patent No.: US 8,558,628 B2
(45) Date of Patent: Oct. 15, 2013

(54) PIEZOELECTRIC VIBRATING PIECE, PIEZOELECTRIC VIBRATOR, OSCILLATOR, ELECTRONIC APPARATUS, AND RADIO TIMEPIECE

(75) Inventor: Takashi Kobayashi, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 6 days.

(21) Appl. No.: 13/369,635

(22) Filed: Feb. 9, 2012

(65) Prior Publication Data

US 2012/0206211 A1  Aug. 16, 2012

(30) Foreign Application Priority Data

Feb. 14, 2011 (JP) ................. 2011-029129

(51) Int. Cl.
*H01L 41/053* (2006.01)
*H03B 5/32* (2006.01)

(52) U.S. Cl.
USPC .......................................... 331/156; 310/370

(58) Field of Classification Search
USPC ........... 331/156, 158; 310/370, 344; 333/200; 29/25.35
See application file for complete search history.

(56) References Cited

U.S. PATENT DOCUMENTS

2011/0140796 A1* 6/2011 Fukuda ..................... 331/158

FOREIGN PATENT DOCUMENTS

JP   2002-164759 A   6/2002
JP   02003142976 A * 5/2003

* cited by examiner

*Primary Examiner* — Joseph Chang
(74) *Attorney, Agent, or Firm* — Brinks Hofer Gilson & Lione

(57) ABSTRACT

A piezoelectric vibrating piece includes a pair of vibration arm portions that is placed in a row in a width direction; a base portion to which proximal end sides in the pair of vibration arm portions in an extending direction are connected; and weight metal films that are formed on outer surfaces of the vibration arm portions, wherein the weight metal films are formed in positions that avoid regions of tip portions in the vibration arm portions in a longitudinal direction.

8 Claims, 12 Drawing Sheets

PIEZOELECTRIC VIBRATING PIECE, PIEZOELECTRIC VIBRATOR, OSCILLATOR, ELECTRONIC APPARATUS, AND RADIO TIMEPIECE

RELATED APPLICATIONS

This application claims priority under 35 U.S.C. §119 to Japanese Patent Application No. 2011-029129 filed on Feb. 14, 2011, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic apparatus, and a radio timepiece.

2. Description of the Related Art

For example, in a mobile phone or a portable information device, in many cases, a piezoelectric vibrator is used which uses crystal or the like as a time source, a timing source such as a control signal, a reference signal source or the like. As the piezoelectric vibrator of this kind, there is a vibrator in which a tuning fork-like piezoelectric vibrating piece is hermetically sealed in a package formed with a cavity.

The package has a structure which causes a concave portion to function as a cavity by superimposing a pair of glass substrates in the state of forming a concave portion in one of the pair of glass substrates and directly bonding both of them. Furthermore, the piezoelectric vibrating piece includes a pair of vibration arm portions which is extended in a longitudinal direction and is placed in a width direction in a row, and a base portion which connects proximal end sides of the both vibration arm portions to each other, and the piezoelectric vibrating piece is configured so that both of the vibration arm portions are vibrated (oscillated) in a direction approaching and being separated from each other at a predetermined resonant frequency by using the proximal end side thereof as a starting point.

As a frequency adjusting method of the vibration arm portion of the case of manufacturing the piezoelectric vibrator configured in this manner, there is a method of adjusting the frequency of the vibration arm portion so as to become an object frequency by forming a weight metal film formed of Cr, Au, Ag or the like at the tip of the vibration arm portion in the piezoelectric vibrating piece in advance and partially removing (trimming) the weight metal film by the laser irradiation (for example, see JP-A-2002-164759).

However, in the piezoelectric vibrator mentioned above, along with a reduction in size of a mobile phone or a portable information terminal device, a further reduction in size and thickness is preferable. For that reason, a clearance between the piezoelectric vibrating piece and an inner surface of the package in the thickness direction is very narrow (for example, about 20 μm to 100 μm).

In this case, during an impact property test or the like which is performed by dropping the piezoelectric vibrator after the hermetical sealing, there is a concern that the vibration arm portion is vibrated in the thickness direction, whereby the tip portion of the vibration arm portion comes into contact with the inner surface of the package. Then, there is a problem in that the weight metal film formed at the tip portion of the vibration arm portion is peeled off by the impact of the time when the vibration arm portion comes into contact with the inner surface of the package, whereby the frequency of the vibration arm portion fluctuates.

In contrast, it is also considered that the weight metal film at the tip portion of the vibration arm portion is positively removed by the laser irradiation, but many weight metal films remain at the tip portion due to a position accuracy (for example, about 20 to 50 μm) of the laser irradiation.

Thus, the present invention was made in view of the problems mentioned above, and an object thereof is to provide a piezoelectric vibrating piece that is able to suppress the peeling of the weight metal film and suppress a fluctuation in frequency, a piezoelectric vibrator, an oscillator, an electronic apparatus, and a radio timepiece.

SUMMARY OF THE INVENTION

In order to solve the problems mentioned above, the present invention provides means as below.

According to an aspect of the present invention, a piezoelectric vibrating piece is provided which includes a pair of vibration arm portions that is placed in a row in a width direction; a base portion to which proximal end sides in the pair of vibration arm portions in an extending direction are connected; and weight metal films that are formed on outer surfaces of the vibration arm portions, wherein the weight metal films are formed to avoid regions of tip portions in the vibration arm portions in the extending direction.

According to the configuration, by forming the weight metal film in a position that avoids the avoidance region in the tip portion of the vibration arm portion, when a piezoelectric vibrating piece (the tip of the vibration arm portion) is vibrated in the thickness direction in the case of hermetically sealing the piezoelectric vibrating piece in the package, even if the tip of the vibration arm portion comes into contact with the inner surface of the package, it is possible to suppress the peeling off of the weight metal film from the vibration arm portion. For that reason, since it is possible to suppress the frequency fluctuation after the frequency adjustment, it is possible to provide a piezoelectric vibrating piece of a high quality having excellent vibration characteristics.

Furthermore, by forming the weight metal film to avoid the avoidance region in advance, there is no need to use a high-precision laser device so as to remove the weight metal film formed at the tip of the vibration arm portion. As a consequence, an increase in manufacturing costs can also be suppressed.

Furthermore, the weight metal film may be partially removed by the laser irradiation, whereby the frequency of the vibration arm portion may be adjusted so as to be an object frequency, and lengths of the avoidance regions in the extending direction may be set so as to be greater than an error due to the laser irradiation.

According to the configuration, when removing the weight metal film of the avoidance region by the laser irradiation, it is possible to reliably remove the weight metal film of the avoidance region regardless of the position accuracy of the laser device. As a result, it is possible to suppress the peeling off of the weight metal film from the vibration arm portion.

Furthermore, according to another aspect of the present invention, a piezoelectric vibrator is provided which is configured so that the piezoelectric vibrating piece of the aspect of the present invention is hermetically sealed in a package.

According to the configuration, since the piezoelectric vibrating piece of the aspect of the present invention is hermetically sealed in the package, it is possible to provide a piezoelectric vibrator of high quality having excellent vibration characteristics by promoting a reduction in size and thinning.

Furthermore, according to still another aspect of the present invention, an oscillator is provided which is configured so that the piezoelectric vibrator of the aspect of the present invention is electrically connected to an integrated circuit as an oscillating element.

Furthermore, according to still another aspect of the present invention, an electronic apparatus is provided which is configured so that the piezoelectric vibrator of the aspect of present invention is electrically connected to a counter portion.

Furthermore, according to still another aspect of the present invention, a radio timepiece is provided which is configured so that the piezoelectric vibrator of the aspect of the present invention is electrically connected to a filter portion.

With the oscillator, the electronic apparatus, and the radio timepiece according to the aspects of the present invention, it is possible to provide a reliable oscillator, electronic apparatus, and a radio timepiece.

According to the piezoelectric vibrating piece of the aspect of the present invention, since it is possible to suppress frequency fluctuation after the frequency adjustment, it is possible to provide the piezoelectric vibrating piece of high quality having excellent vibration characteristics.

According to the piezoelectric vibrator, it is possible to provide a piezoelectric vibrator of high quality having excellent vibration characteristics.

With the oscillator, the electronic apparatus, and the radio timepiece of the aspect of the present invention, it is possible to provide the reliable oscillator, electronic apparatus, and radio timepiece.

DETAILED DESCRIPTION OF THE PREFERRED EMBODIMENTS

Hereinafter, an embodiment of the present invention will be described based on the drawings.

(Piezoelectric Vibrator)

Figure 1:
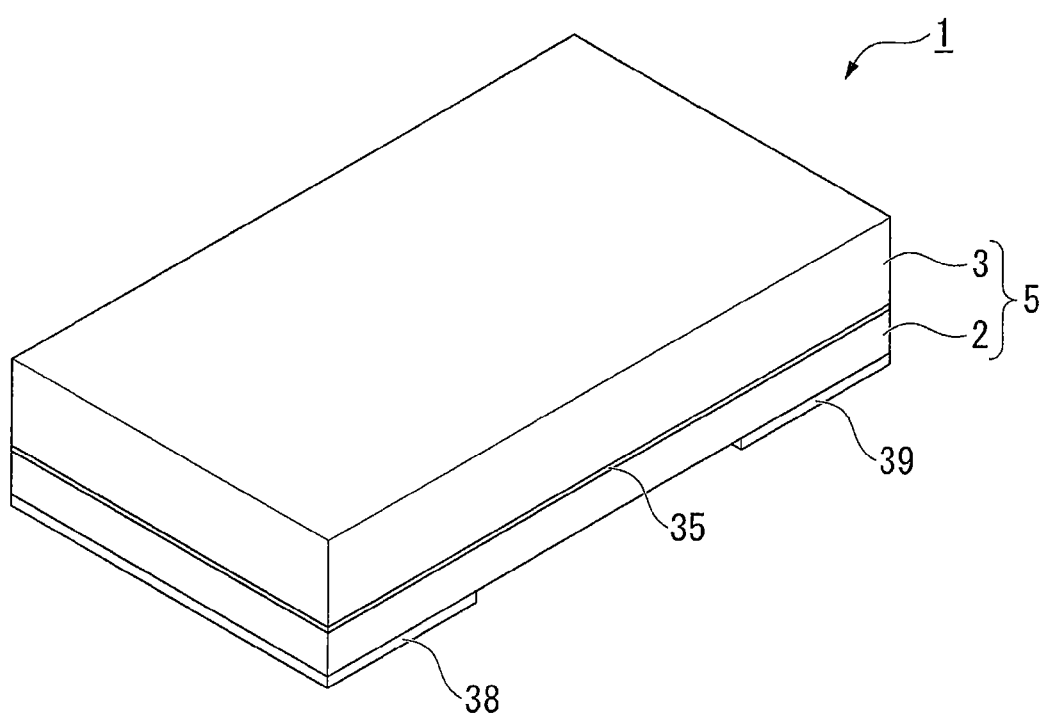
FIG. 1 is an exterior perspective view that shows a piezoelectric vibrator according to an embodiment of the present invention.
Figure 2:
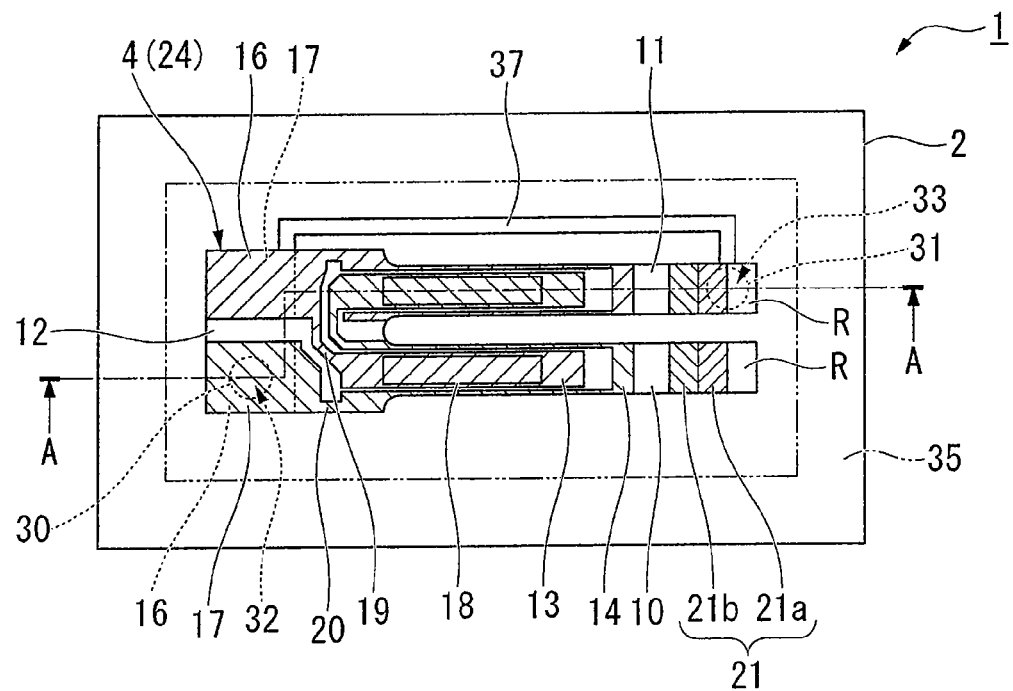
FIG. 2 is a plan view that shows an internal configuration of the piezoelectric vibrator shown in FIG. 1 with a lead substrate detached therefrom.
Figure 3:
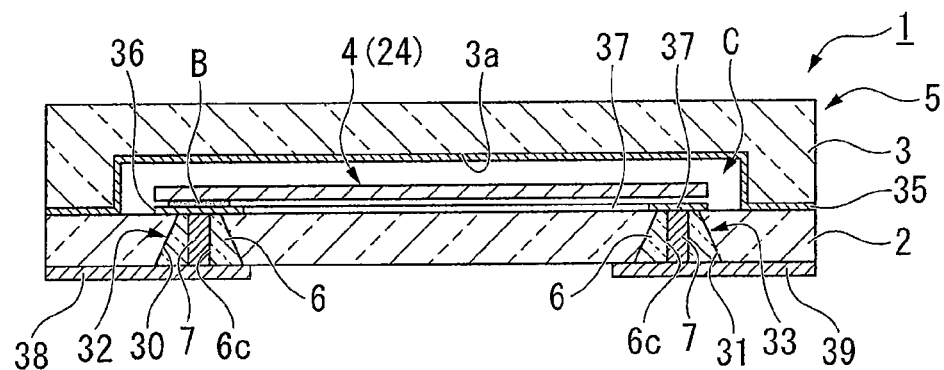
FIG. 3 is a cross-sectional view taken along the lines A-A of FIG. 2.
Figure 4:
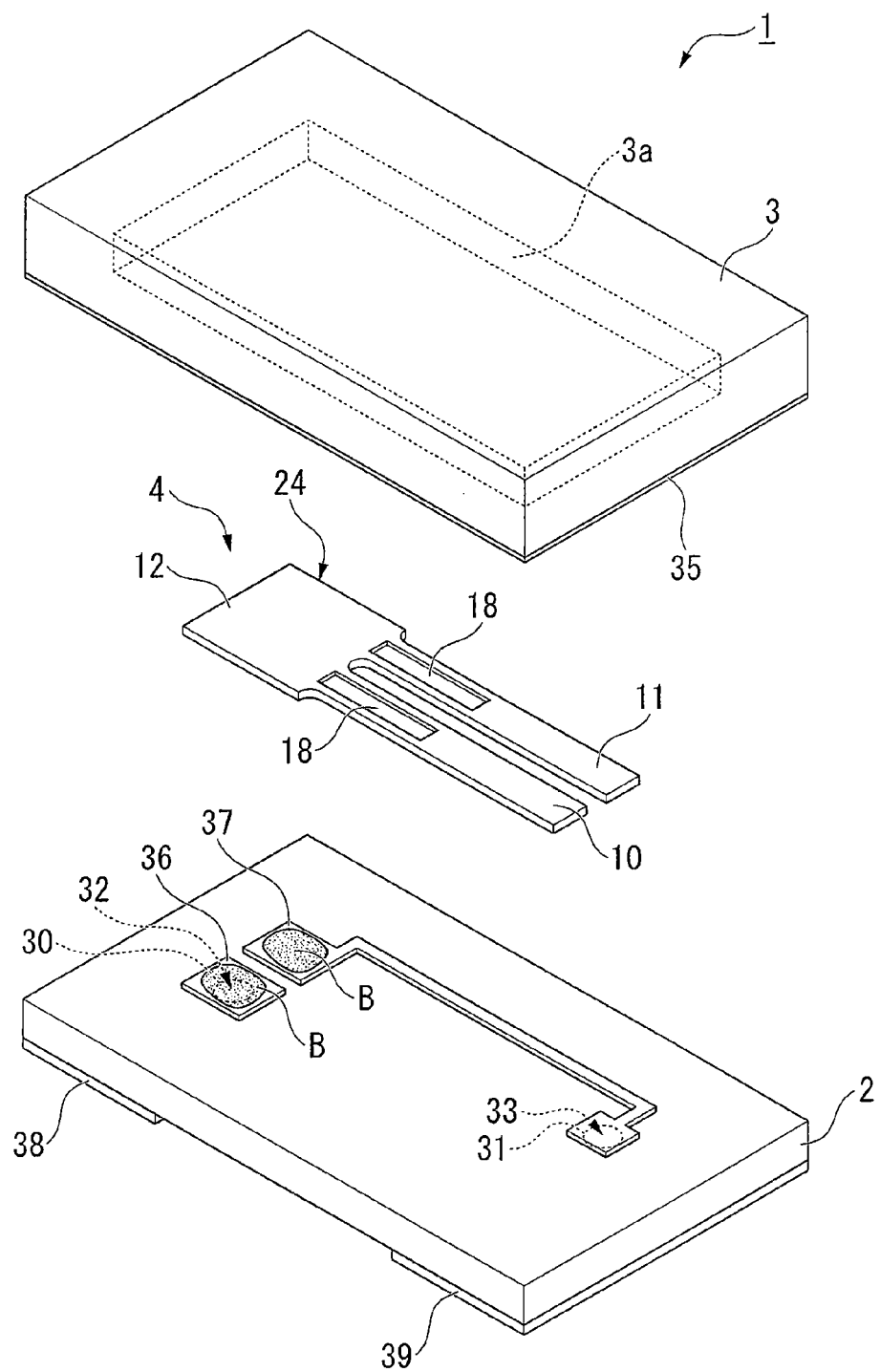
FIG. 4 is an exploded perspective view of the piezoelectric vibrator shown in FIG. 1.

FIG. 1 is an exterior perspective view in which a piezoelectric vibrator in the present embodiment is viewed from a lead substrate side. Furthermore, FIG. 2 is an internal configuration diagram of the piezoelectric vibrator in which the piezoelectric vibrating piece is viewed from the upper part with the lead substrate detached therefrom. Furthermore, FIG. 3 is a cross-sectional view of the piezoelectric vibrator taken along lines A-A shown in FIG. 2, and FIG. 4 is an exploded perspective view of the piezoelectric vibrator.

As shown in FIGS. 1 to 4, a piezoelectric vibrator 1 of the present embodiment is a surface mounted type piezoelectric vibrator which has a box-shaped package 5 in which a base substrate 2 and a lead substrate 3 are anodically bonded to each other via a bonding material 35, and has a piezoelectric vibrating piece 4 that is sealed in a cavity C in an inner portion of the package 5. In addition, in FIG. 4, in order to clarify the drawings, an excitation electrode 15, drawing electrodes 19, 20, mount electrodes 16 and 17, and a weight metal film 21 described below are not shown.

Figure 5:
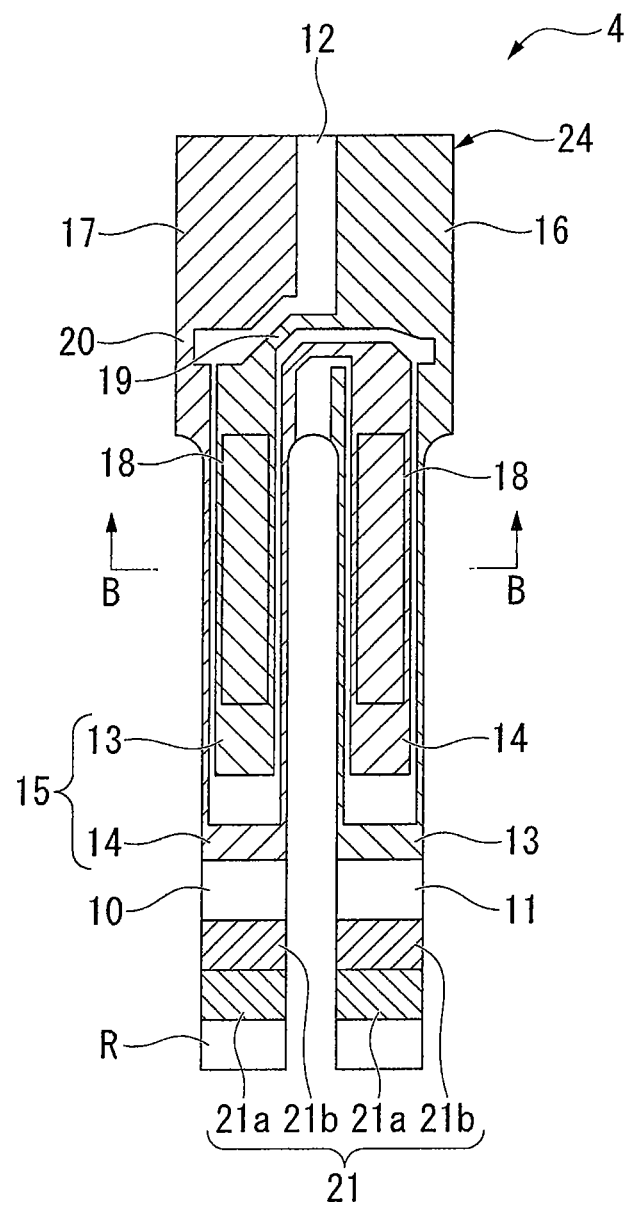
FIG. 5 is a plan view of the piezoelectric vibrating piece.
Figure 6:
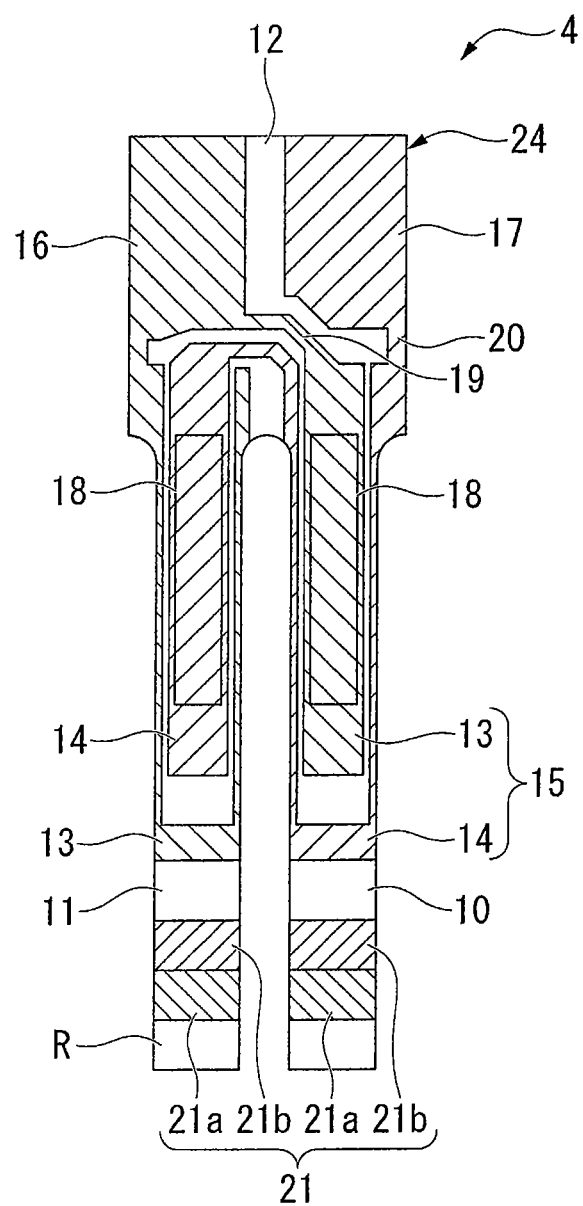
FIG. 6 is a bottom view of the piezoelectric vibrating piece.
Figure 7:
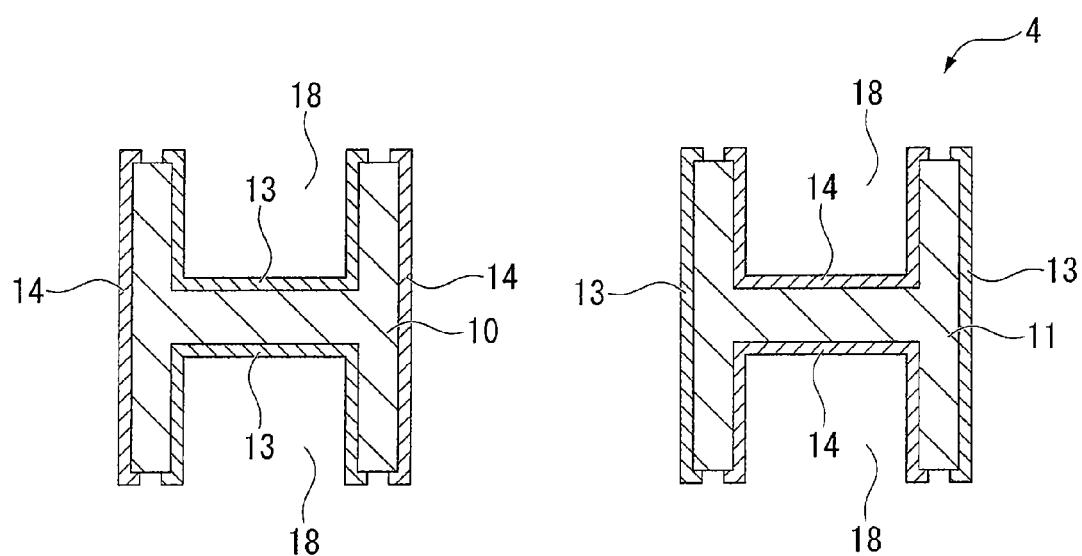
FIG. 7 is a cross-sectional view taken from lines B-B of FIG. 5.

FIG. 5 is a plan view of the piezoelectric vibrating piece 4 that constitutes the piezoelectric vibrator 1, FIG. 6 is a bottom view of the piezoelectric vibrating piece 4, and FIG. 7 is a cross-sectional view taken along lines B-B of FIG. 5.

As shown in FIGS. 5 to 7, the piezoelectric vibrating piece 4 is vibrated when a predetermined voltage is applied, and includes a tuning fork-shaped piezoelectric plate 24 that is formed of a piezoelectric material such as crystal, lithium tantalite, and lithium niobate.

The piezoelectric plate 24 has a pair of vibration arm portions 10 and 11 disposed in parallel, and a base portion 12 that integrally fixes a proximal end side of the pair of vibration arm portions 10 and 11. Furthermore, on an outer surface of the piezoelectric plate 24, there are provided an excitation electrode 15 that is constituted by a first excitation electrode 13 and a second excitation electrode 14, which vibrate the pair of vibration arm portions 10 and 11, and mount electrodes 16 and 17, which are electrically connected to the first excitation electrode 13 and the second excitation electrode 14.

Furthermore, in the piezoelectric plate 24, on both main surfaces of the pair of vibration arm portions 10 and 11, groove portions 18, which are formed along a longitudinal direction (an extending direction) of the vibration arm portions 10 and 11, respectively, are formed. The groove portions 18 are formed so as to reach a portion near approximately the middle from the proximal end sides of the vibration arm portions 10 and 11.

The excitation electrode 15 including the first excitation electrode 13 and the second excitation electrode 14 is an electrode that vibrates the pair of vibration arm portions 10 and 11 in a direction approaching or being separated from each other at a predetermined frequency, and is patterned and formed on the outer surfaces of the pair of vibration arm portions 10 and 11 in the state of being electrically separated, respectively.

Specifically, on the groove portions 18 of one vibration arm portion 10 and on both surfaces of the other vibration arm portion 11, the first excitation electrode 13 is mainly formed. Furthermore, on both surfaces of one vibration arm portion 10 and on the groove portion 18 of the other vibration arm portion 11, the second excitation electrode 14 is mainly formed.

In addition, the first excitation electrode 13 and the second excitation electrode 14 are electrically connected to the mount electrodes 16 and 17 via the drawing electrodes 19 and 20 on both main surfaces of the base portion 12, respectively. The piezoelectric vibrating piece 4 is applied with the voltage via the mount electrodes 16 and 17. In addition, the excitation electrode 15, the mount electrodes 16 and 17, and the drawing electrodes 19 and 20 mentioned above are configured so that, for example, a base film (not shown) formed of chrome (Cr) or the like and a finishing film (not shown) formed of gold (Au) or the like are sequentially stacked on the outer surface of the piezoelectric plate 24. The base film improves adhesion between the finishing film and the piezoelectric vibrating piece 4.

Furthermore, the outer surfaces of the pair of vibration arm portions 10 and 11 are coated with a frequency adjusting weight metal film 21 so that the vibration state thereof is vibrated in a predetermined frequency range. The weight metal film 21 is divided into a rough adjustment film 21a that is used when roughly adjusting the frequency and a minute adjustment film 21b used when minutely adjusting the frequency. By performing the frequency adjustment by the use of the weights of the rough adjustment film 21a and the minute adjustment film 21b, it is possible to put the frequencies of the pair of vibration arm portions 10 and 11 within an objective frequency of the device.

In the weight metal film 21, the rough adjustment films 21a formed at the tip sides of the vibration arm portions 10 and 11 are formed so that a base film (not shown) and a finishing film (not shown) are sequentially stacked on each other. Meanwhile, the minute adjustment films 21b formed at the proximal end side further than the rough adjustment films 21a are constituted by the base film. That is, the base film and the finishing film constituting the weight metal film 21 are constituted by the same material as those of the excitation electrode 15, the mount electrodes 16 and 17, and the drawing electrodes 19 and 20 mentioned above.

Herein, the weight metal films 21 are formed at position avoiding the tip portions in the vibration arm portions 10 and 11 in the longitudinal direction. Specifically, the tip portions of the vibration arm portions 10 and 11 are avoidance regions R in which the weight metal film 21 is not formed over all the regions of the vibration arm portions 10 and 11 in a transverse direction (the width direction), and the rough adjustment film 21a and the minute adjustment film 21b are formed along the longitudinal direction of the vibration arm portions 10 and 11 in a row at the proximal end side further than the avoidance region R. In addition, the length of the avoidance region R of the vibration arm portions 10 and 11 in the longitudinal direction is longer than the position accuracy (20 μm to 50 μm) of laser light in a trimming process described below, and for example, it is desirable to set the length to about 25 μm to 55 μm.

As shown in FIGS. 3 and 4, the piezoelectric vibrating piece 4 configured in this manner is bump-bonded to an upper surface of the base substrate 2 by the use of a bump B such as gold. More specifically, on two bumps B formed on leading electrodes 36 and 37 described below that are patterned on the upper surface of the base substrate 2, each of the pair of mount electrodes 16 and 17 are bump-bonded in the contact state, respectively.

As a result, the piezoelectric vibrating piece 4 is supported in the state of floating from the upper surface of the base substrate 2, and the mount electrodes 16 and 17 and the leading electrodes 36 and 37 are electrically connected to each other, respectively.

As shown in FIGS. 1, 3, and 4, the lead substrate 3 is a transparent insulation substrate formed of a glass material, for example, a soda-lime glass, and is formed in a plate shape. At the bonding surface side bonded with the base substrate 2, a rectangular concave portion 3a is formed into which the piezoelectric vibrating piece 4 enters. The concave portion 3a is a concave portion for the cavity becoming the cavity C that accommodates the piezoelectric vibrating piece 4 when both of the substrates 2 and 3 overlap each other.

On the whole lower surface of the lead substrate 3, a bonding material 35 for the anodic bonding is formed. Specifically, the bonding material 35 is formed over the entire bonding surface with the base substrate 2 and over the entire inner surface of the concave portion 3a. The bonding material 35 of the present embodiment is formed by Si film, but the bonding material 35 is also able to be formed of Al. Furthermore, it is also possible to adopt a Si bulk material having low resistance by doping or the like, as the bonding material. Furthermore, the bonding material 35 and the base substrate 2 are anodically bonded to each other in the state of causing the concave portion 3a to face the base substrate 2 side, whereby the cavity C is hermetically sealed.

As shown in FIGS. 1 to 4, the base substrate 2 is a transparent insulation substrate formed of a glass material like the lead substrate 3, for example, a soda-lime glass, and is formed in a plate shape having a size that can overlap the lead substrate 3. The base substrate 2 is formed with a pair of through holes 30 and 31 that penetrates the base substrate 2. At this time, the pair of through holes 30 and 31 is formed so as to enter the cavity C.

More specifically, among the through holes 30 and 31 of the present embodiment, one through hole 30 is formed at a position corresponding to the base portion 12 side of the mounted piezoelectric vibrating piece 4. Furthermore, the other through hole 31 is formed at a position corresponding to the tip ends of the vibration arm portions 10 and 11. Furthermore, the through holes 30 and 31 are formed in a taper-shaped cross section in which the diameters thereof are gradually reduced from the lower surface of the base substrate 2 toward the upper surface.

In addition, in the present embodiment, a case was described where the respective through holes 30 and 31 are formed in the taper-shaped cross section, but a through hole may be adopted which directly penetrates the base substrate 2, without being limited thereto. In any case, the through hole may penetrate the base substrate 2.

Moreover, the pair of through holes 30 and 31 is formed with a pair of penetration electrodes 32 and 33 that is formed so as to bury the respective through holes 30 and 31.

As shown in FIG. 3, the penetration electrodes 32 and 33 are formed by a barrel 6 integrally fixed to the through holes 30 and 31 by burning, and a core portion 7. The respective penetration electrodes 32 and 33 play a role in completely blocking the through holes 30 and 31 to maintain the air-tightness in the cavity C and conducting external electrodes 38 and 39 described later and the leading electrodes 36 and 37.

The barrel 6 is burned by a paste-like glass frit. The barrel 6 has flat both ends and is formed in a cylindrical shape having approximately the same thickness as the base substrate 2. Moreover, in the center of the barrel 6, the core portion 7 is disposed so as to penetrate the barrel 6. Additionally, in the present embodiment, according to the shapes of the through holes 30 and 31, the exterior of the barrel 6 is formed in a conical shape (taper-shaped cross section). Moreover, the barrel 6 is burned in the state of being buried in the through holes 30 and 31, whereby the barrel 6 is firmly fixed to the through holes 30 and 31.

The core portion 7 is a conductive core formed in a columnar shape by a metallic material, has flat both ends like the barrel 6, and is formed so as to have approximately the same thickness as that of the base substrate 2.

In addition, as shown in FIG. 3, when the penetration electrodes 32 and 33 are formed as finished products, the core portion 7 is formed so as to have approximately the same thickness as that of the base substrate 2. However, in the manufacturing course, as the length of the core portion 7, a length is adopted which is set to be shorter than the thickness of the initial base substrate 2 of the manufacturing course by 0.02 mm. Moreover, the core portion 7 is situated in the center hole 6c of the barrel 6, whereby the core portion 7 is firmly fixed to the barrel 6 by the burning of the barrel 6.

Furthermore, in the penetration electrodes 32 and 33, the electrical conductivity is ensured through the conductive core portion 7.

As shown in FIGS. 1 to 4, at the upper surface side (the bonding surface side with the lead substrate 3 bonded thereto) of the base substrate 2, the pair of leading electrodes 36 and 37 is patterned by a conductive material (for example, aluminum). The pair of leading electrodes 36 and 37 is patterned so as to electrically connect one penetration electrode 32 with one mount electrode 16 of the piezoelectric vibrating piece 4 and electrically connect the other penetration electrode 33 and the other mount electrode 17 of the piezoelectric vibrating piece 4, among the pair of penetration electrodes 32 and 33. More specifically, one leading electrode 36 is formed immediately over the penetration electrode 32 so as to be situated immediately under the base portion 12 of the piezoelectric vibrating piece 4. Furthermore, the other leading electrode 37 is formed so as to be situated immediately over the other penetration electrode 33 after being drawn from a position adjacent to one leading electrode 36 to the tip sides of the vibration arm portions 10 and 11 along the vibration arm portions 10 and 11.

Moreover, the bumps B are formed on the pair of leading electrodes 36 and 37, respectively, and the piezoelectric vibrating piece 4 is mounted by the use of the bumps B. As a result, one mount electrode 16 of the piezoelectric vibrating piece 4 is conducted to one penetration electrode 32 via one leading electrode 36. Additionally, the other mount electrode 17 is conducted to the other penetration electrode 33 via the other leading electrode 37.

As shown in FIGS. 1, 3, and 4, on the lower surface of the base substrate 2, external electrodes 38 and 39 electrically connected to each of the pair of penetration electrodes 32 and 33 are formed. That is, one external electrode 38 is electrically connected to the first excitation electrode 13 of the piezoelectric vibrating piece 4 via one penetration electrode 32 and one leading electrode 36.

Furthermore, the other external electrode 39 is electrically connected to the second excitation electrode 14 of the piezoelectric vibrating piece 4 via the other penetration electrode 33 and the other leading electrode 37.

In the case of operating the piezoelectric vibrator 1 configured in this manner, a predetermined driving voltage is applied to the external electrodes 38 and 39 formed in the base substrate 2. As a result, it is possible to cause the electric current to flow in the excitation electrode 15 including the first excitation electrode 13 and the second excitation electrode 14 of the piezoelectric vibrating piece 4, whereby the pair of vibration arm portions 10 and 11 can be vibrated in a direction approaching and being separated from each other at a predetermined frequency. Moreover, the vibration of the pair of vibration arm portions 10 and 11 can be used as a timing source of the time source, the control signal, a reference signal source or the like.

(Method of Manufacturing Piezoelectric Vibrator)

Figure 8:
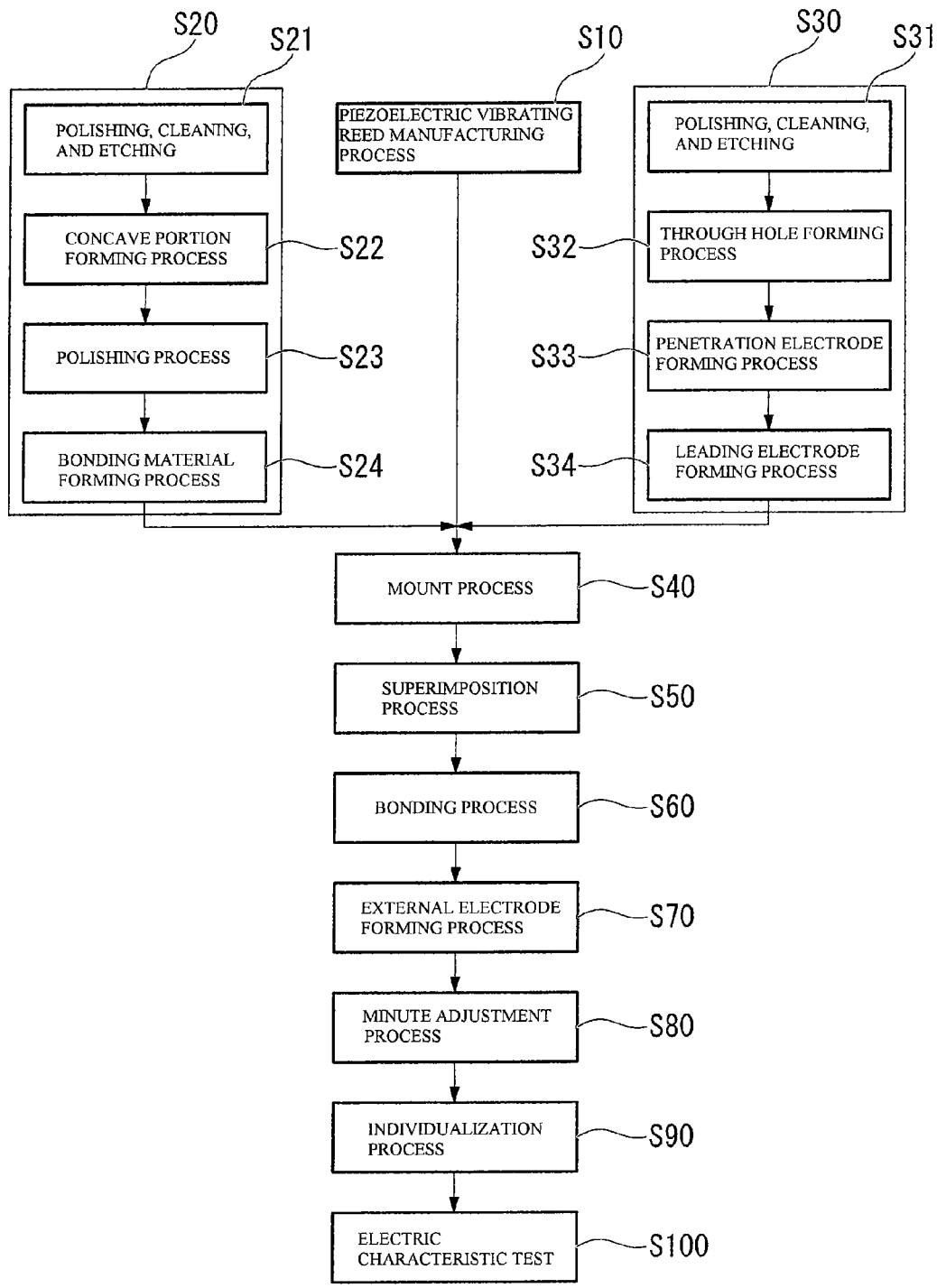
FIG. 8 is a flowchart that shows a method of manufacturing the piezoelectric vibrator.
Figure 9:
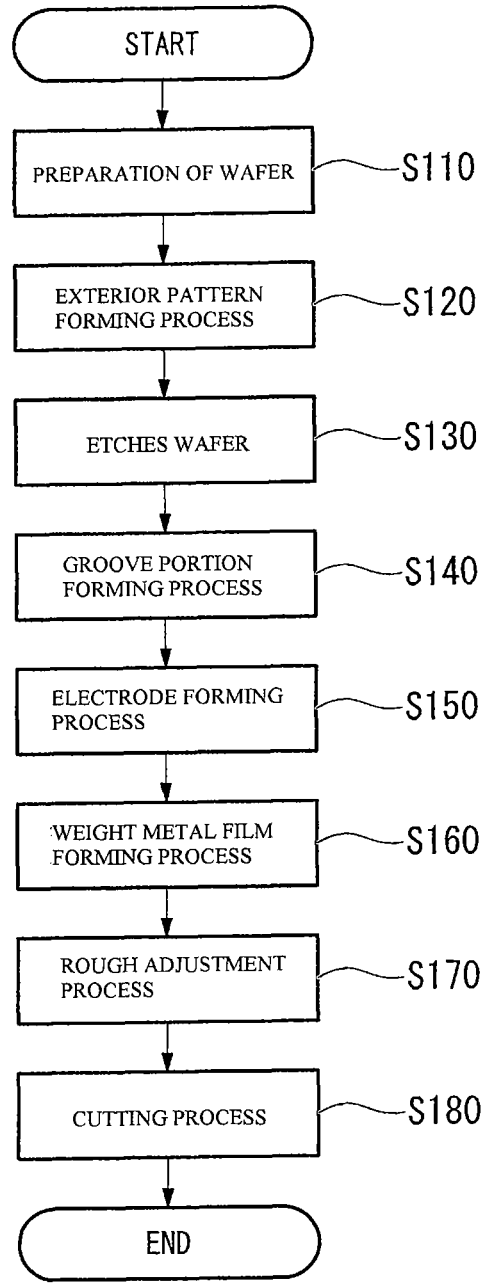
FIG. 9 is a flowchart that shows a method of manufacturing the piezoelectric vibrating piece.

Next, a method of manufacturing the piezoelectric vibrator 1 mentioned above will be described. FIG. 8 is a flowchart that shows a method of manufacturing the piezoelectric vibrator, FIG. 9 is a flowchart that shows a piezoelectric vibrating piece production process, and FIG. 10 is an exploded perspective view of a wafer bonding body.

Figure 10:
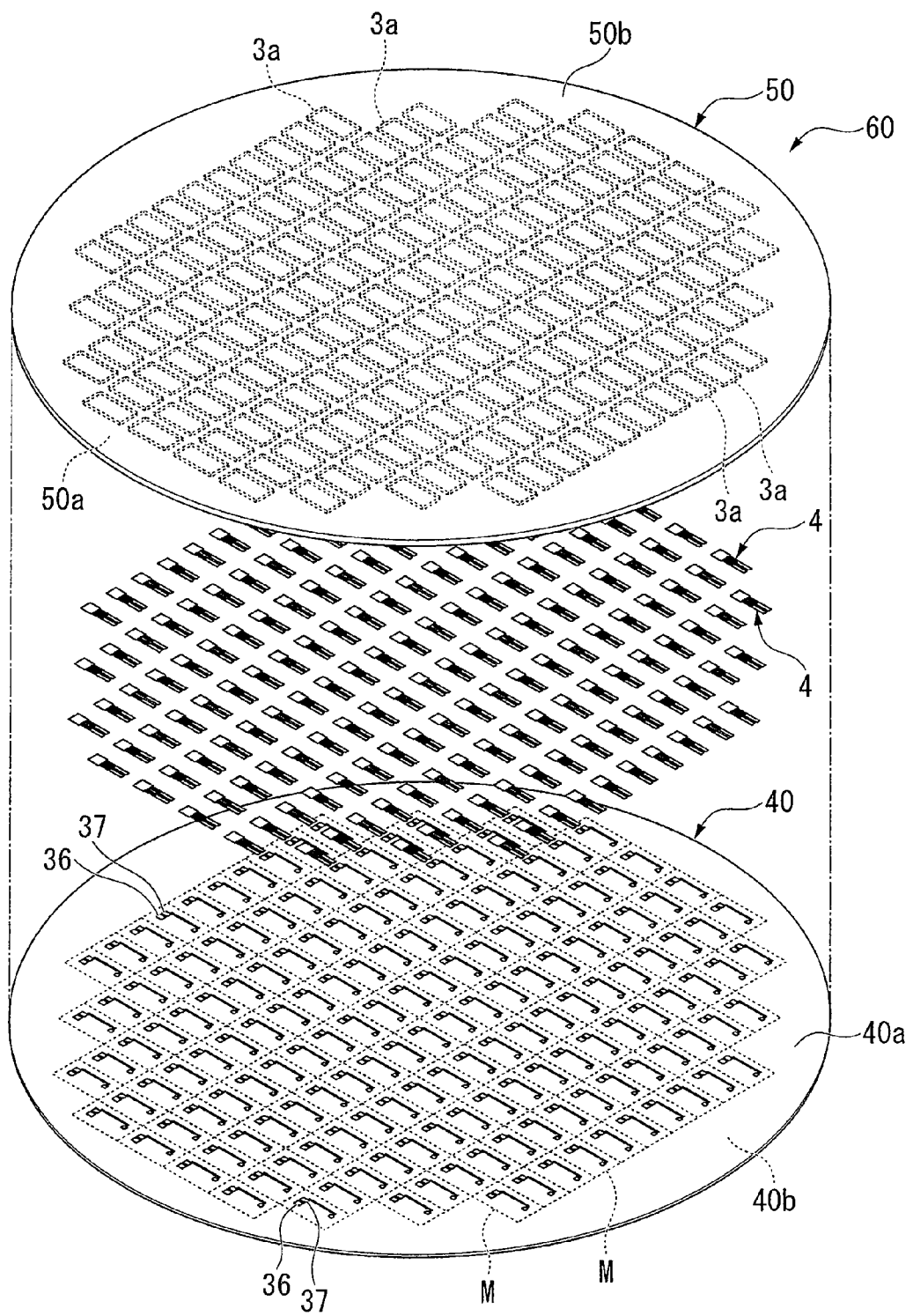
FIG. 10 is an exploded perspective view of a wafer bonding body.

As shown in FIGS. 8 and 10, in the method of manufacturing the piezoelectric vibrator 1, a method will be described by which a plurality of piezoelectric vibrating piece 4 is sealed between the base substrate wafer 40 with the plurality base substrates 2 extended thereon and the lead substrate wafer 50 with the plurality of lead substrates 3 extended thereon to form a wafer bonding body 60, and a plurality of piezoelectric vibrators 1 is concurrently manufactured by cutting the wafer bonding body 60. In addition, a dashed-line M shown in FIG. 10 shows a cutting line that is cut in the cutting process.

The method of manufacturing the piezoelectric vibrator 1 in the present embodiment mainly has a piezoelectric vibrating piece production process (S10), a lead substrate wafer production process (S20), a base substrate wafer production process (S30), and an assembling process (after S40). Among them, it is possible to perform the piezoelectric vibrating piece production process (S10), the lead substrate wafer production process (S20), and the base substrate wafer production process (S30) in parallel.

(Piezoelectric Vibrating Piece Production Process)

Firstly, as shown in FIGS. 8 and 9, the piezoelectric vibrating piece production process (S10) is performed to produce the piezoelectric vibrating piece 4 (see FIGS. 5 and 6). Specifically, a Lambert ore of crystal is sliced at a predetermined angle to form a wafer (not shown) of a predetermined thickness. Next, after the wafer is wrapped and roughed, a damaged layer is removed by etching, and then the wafer is formed to have a predetermined thickness by performing a specular working such as polishing (S110).

Next, an external form pattern (not shown) for patterning the exterior shapes of the plurality of piezoelectric plates 24 is formed from the wafer (an external form pattern forming process S120). The external form pattern is formed by patterning the metal film on both sides of the wafer which are polished as to be modeled after the external forms of the pair of vibration arm portions 10 and 11 and the base portion 12. At this time, the patterning is collectively performed by the number of the plurality of the piezoelectric vibrating piece s 4 formed on the wafer.

Next, the etching working is performed from both sides of the water, respectively by setting the patterned external form pattern as the mask (S130). As a result, a region is selectively removed which is not masked by the external form pattern. As a consequence, the wafer patterned by the external form pattern is formed in an external form shape of the piezoelectric plate 24.

Next, a groove portion forming process is formed in which groove portions 18 are formed on both main surfaces of the pair of vibration arm portions 10 and 11 (see FIGS. 5 and 6) (S140). The groove portion 18 can be formed by etching the vibration arm portions 10 and 11.

Next, an electrode forming process is performed in which the excitation electrodes 13 and 14, the drawing electrodes 19 and 20, and the mount electrodes 16 and 17 are formed, respectively, by patterning the electrode films on the outer surfaces of the plurality of piezoelectric plate 24 (S150). Specifically, the electrode forming process is performed by forming the electrode films on the outer surface of the piezoelectric plate 24 formed of the groove portion 18, by the vapor deposition method, the sputtering method or the like and then etching the electrode film.

After the electrode forming process (S150) is finished, a weight metal film 21 including the rough adjustment film 21a and the minute adjustment film 21*b* for the frequency adjustment is formed at the tips of the pair of vibration arm portions 10 and 11 (a weight metal film forming process: S160). The weight metal film 21 firstly forms the base film in the forming region of the rough adjustment film 21*a* and the minute adjustment film 21*b*, and then forms the finishing film on the forming region of the rough adjustment film 21*a* in the base film. At this time, the patterning is performed so that the weight metal film 21 is formed at the proximal end side further than the avoidance region R of the tip portion in the vibration arm portions 10 and 11. In addition, the minute adjustment film 21*b* is configured so that the film thickness is set to, for example, about 1500 Å, and the rough adjustment film 21*a* is configured so that the film thickness is set to, for example, about 3 μm. Furthermore, in the present embodiment, a case was described where the electrode portions of the excitation electrodes 13 and 14, the drawing electrodes 19 and 20, and the mount electrodes 16 and 17, and the weight metal film 21 are formed in separate processes, respectively, but the electrode portion and the weight metal film 21 mentioned above can be collectively formed in the same process.

Next, a rough adjustment process of roughly adjusting the frequency is performed on all the vibration arm portions 10 and 11 formed in the wafer (S170). The process is performed by irradiating the rough adjustment film 21*a* of the weight metal film 21 with laser light to evaporate a part thereof, and changing the weight. Specifically, firstly, the frequencies of all the vibration arms portions 10 and 11 formed in the wafer are collectively measured, and a trimming amount is calculated depending on a difference between the measured frequency and the predetermined object frequency. After that, based on the calculation result of the trimming amount, the tip of the rough adjustment film 21*a* of the weight metal film 21 is irradiated with laser light to remove (trim) the rough adjustment film 21*a*. In addition, a minute adjustment, which further accurately adjusts the resonance frequency, is performed after the mount.

After the rough adjustment process (S170) is finished, finally, a cutting process is performed which cuts the connection portion connecting the wafer with the piezoelectric plate 24, separates the plurality of piezoelectric plate 24 from the wafer to form individual pieces (S180). As a result, it is possible to manufacture a plurality of tuning fork-like piezoelectric vibrating piece 4 from a sheet of wafer at a time.

At this point of time, the manufacturing process of the piezoelectric vibrating piece 4 is finished, and the piezoelectric vibrating piece 4 shown in FIG. 5 can be obtained.
(Lead Substrate Wafer Production Process)

Next, as shown in FIGS. 8 and 10, a lead substrate wafer production process is performed which manufactures the lead substrate wafer 50 becoming the lead substrate 3 later up to the state of immediately before performing the anodic bonding (S20).

Specifically, after the soda-lime glass is polished up to a predetermined thickness and is cleaned, a disk-like lead substrate wafer 50 is formed in which the damaged layer of the top surface thereof is removed by the etching or the like (S21).

Next, a concave portion forming process is performed which forms a plurality of concave portions 3*a* for the cavity C on a back 50*a* (a lower surface in FIG. 6) of the lead substrate wafer 50 in a matrix direction by the etching or the like (S22).

Next, in order to ensure the air-tightness between the lead substrate wafer 50 and a base substrate wafer 40 described later, a polishing process (S23) is performed which at least polishes the back 50*a* side of the lead substrate wafer 50 becoming the bonding surface with the base substrate wafer 40, thereby performing the specular working of the back 50*a*.

Next, a bonding material forming process (S24) is performed which forms the bonding material 35 on the whole (the bonding surface between the lead substrate wafer 50 and the base substrate wafer 40, and the inner surface of the concave portion 3*a*) of the back 50*a* of the lead substrate wafer 50. In this manner, by forming the bonding material 35 on the whole of the back 50*a* of the lead substrate wafer 50, the patterning of the bonding material 35 is unnecessary, whereby the manufacturing costs can be reduced. In addition, the forming of the bonding material 35 can be performed by the film forming method such as sputtering or a CVD. Furthermore, since the bonding surface is polished before the bonding material forming process (S24), the flatness of the surface of the bonding material 35 is ensured, whereby it is possible to realize the stable bonding with the base substrate wafer 40.

In this manner, the lead substrate wafer production process (S20) is finished.
(Base Substrate Wafer Production Process)

Next, simultaneously with or before or after the process described above, a base substrate wafer production process is performed which manufactures the base substrate wafer 40 becoming the base substrate 2 later up to the state of immediately before performing the anodic bonding (S30).

Firstly, after the soda-lime glass is polished up to a predetermined thickness and is cleaned, the disc-like base substrate wafer 40 is formed in which the damaged layer of the top surface thereof is removed by the etching or the like (S31).

Next, a through hole forming process is performed which forms a plurality of through holes 30 and 31 for disposing a pair of penetration electrodes 32 and 33 in the base substrate wafer, for example, by the press working or the like (S32). Specifically, after forming the concave portion from the back 40*b* of the base substrate wafer 40 by the press working or the like, by performing the polishing at least from the surface 40*a* side of the base substrate wafer 40, the concave portion is penetrated and the through holes 30 and 31 can be formed.

Next, a penetration electrode forming process (S33) is performed which forms the penetration electrodes 32 and 33 in the through holes 30 and 31 formed in the through hole forming process (S32).

As a result, in the through holes 30 and 31, the core portion 7 is held in the state flush with both surfaces 40*a* and 40*b* of the base substrate wafer 40. In this manner, the penetration electrodes 32 and 33 can be formed.

Next, a leading electrode forming process is performed which forms the leading electrodes 36 and 37 formed of the conductive film on the surface 40*a* of the base substrate wafer 40 (S34). In this manner, the base substrate wafer production process (S30) is finished.

Next, the piezoelectric vibrating piece 4 manufactured in the piezoelectric vibrating piece creation process (S10) are mounted on the respective leading electrodes 36 and 37 of the base substrate wafer 40 created by the base substrate wafer creation process (S30) via the bump B such as gold, respectively (a mounting process: S40).

Moreover, a superimposition process is performed which superimposes the base substrate wafer 40 created by the creation process of the respective wafers 40 and 50 mentioned above with the lead substrate wafer 50 (a superimposition process: S50). Specifically, both of the wafers 40 and 50 are aligned in a correct position while setting a standard mark (not shown) or the like as an indicator. As a result, the mounted piezoelectric vibrating piece 4 is received in the cavity C that is surrounded by the concave portion 3a formed in the lead substrate wafer 50 and the base substrate wafer 40.

After the superimposition process, a bonding process is performed which applies a predetermined voltage at a predetermined temperature atmosphere to perform the anodic bonding in the state of putting the two superimposed wafers 40 and 50 into an anodic bonding device (not shown) and clamping an outer peripheral portion of the wafer by a holding mechanism (not shown) (S60). Specifically, a predetermined voltage is applied between the bonding material 35 and the lead substrate wafer 50. Then, an electrochemical reaction occurs in an interface between the bonding material 35 and the lead substrate wafer 50, and both of them are firmly brought into close-contact with each other and are anodically bonded to each other. As a result, the piezoelectric vibrating piece 4 can be sealed in the cavity C, whereby it is possible to obtain a wafer bonding body 60 in which the base substrate wafer 40 is bonded to the lead substrate wafer 50.

Moreover, by anodically bonding both of the wafers 40 and 50 like the present embodiment, a time degradation, a deviation due to an impact or the like, a bending state of the wafer bonding body 60 or the like is prevented, whereby both of the wafers 40 and 50 can more firmly be bonded, compared to a case of bonding both of the wafers 40 and 50 by an adhesive or the like.

Moreover, after the anodic bonding mentioned above is finished, an external electrode forming process is performed which patterns the conductive material on the back 40b of the base substrate wafer 40 and forms a plurality of external electrodes 38 and 39 that is electrically connected to the pair of penetration electrodes 32 and 33, respectively (S70). By the process, the piezoelectric vibrating piece 4 sealed in the cavity C can be operated by the use of the external electrodes 38 and 39.

Next, as shown in FIG. 8, a minute adjustment process of minutely adjusting the frequencies of the individual piezoelectric vibrating pieces 4 sealed in the package 5 to enter the range of the object frequency is performed by the use of a trimming device (not shown) (S80). Specifically, the voltage is applied to the external electrodes 38 and 39 to vibrate the piezoelectric vibrating piece 4. Moreover, laser light is irradiated from the outside through the lead substrate wafer 50 while measuring the frequency, thereby evaporating the minute adjustment film 21b of the weight metal film 21. As a result, since the weights of the tip sides of the pair of vibration arm portions 10 and 11 are changed, the frequency of the piezoelectric vibrating piece 4 can be minutely adjusted so as to enter a predetermined range of the nominal frequency.

After the minute adjustment process (S80) is finished, an individual process is performed which cuts the bonded wafer bonding body 60 along the cutting line M to form individual pieces (S90).

Next, an electrical characteristic test of the inner portion of the individualized piezoelectric vibrator 1 is performed (S100).

In the electrical characteristic test (S100), the frequency, the resistance value, the drive level characteristic (an excitation electric power dependence of the frequency and the resistance value) of the piezoelectric vibrating piece 4 or the like are measured and checked. Furthermore, an insulation resistance characteristic, an impact characteristic performed by dropping the piezoelectric vibrator 1 or the like are checked. Moreover, an exterior test of the piezoelectric vibrator 1 is performed, and the size, the quality or the like is finally checked. Thereby, the manufacturing of the piezoelectric vibrator 1 is finished.

In this manner, in the present embodiment, a configuration was adopted in which the weight metal film 21 is formed in a position avoiding an avoidance region R of the tip portions in the vibration arm portions 10 and 11 in the longitudinal direction.

According to the configuration, when the vibration arm portions 10 and 11 are vibrated in the thickness direction, for example, by the time of the impact test or the like, even in a case where the tip portions of the vibration arm portions 10 and 11 come into contact with the inner surface of the package 5, it is possible to suppress that the weight metal film 21 is peeled off from the vibration arm portions 10 and 11. For that reason, since the frequency does not fluctuate after the frequency adjustment, it is possible to provide the piezoelectric vibrating piece 4 of high quality having the excellent vibration characteristic.

Furthermore, by forming the weight metal film 21 to avoid the avoidance region R in advance by the patterning, there is no need to use a high-precision laser device so as to remove the weight metal film 21 formed at the tip portions of the vibration arm portions 10 and 11. As a consequence, an increase in manufacturing costs can also be suppressed.

Moreover, since the piezoelectric vibrating piece 4 is hermetically sealed in the package 5, it is possible to provide the piezoelectric vibrator 1 of a high quality having excellent vibration characteristic over a long period of time, by promoting a reduction in size and the thickness.

(Oscillator)

Next, an embodiment of an oscillator according to the aspects of the present invention will be described with reference to FIG. 11.

Figure 11:
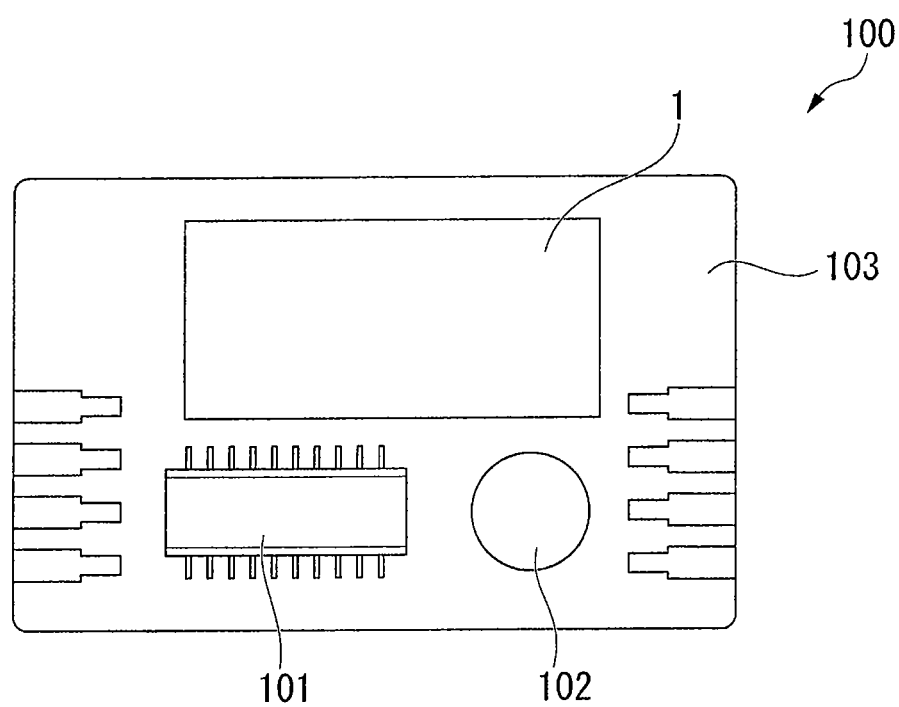
FIG. 11 is a schematic configuration diagram of an oscillator in an embodiment of the present invention.

As shown in FIG. 11, the oscillator 100 of the present embodiment is configured as an oscillating element in which the piezoelectric vibrator 1 is electrically connected to an integrated circuit 101. The oscillator 100 includes a substrate 103 with an electronic component 102 such as a condenser mounted thereon. The integrated circuit 101 for the oscillator mentioned above is mounted on the substrate 103, and the piezoelectric vibrating piece 4 of the piezoelectric vibrator 1 is mounted near the integrated circuit 101. The electronic component 102, the integrated circuit 101, and the piezoelectric vibrator 1 are electrically connected by a wiring pattern (not shown). In addition, the respective components are molded by resin (not shown).

In the oscillator 100 configured in this manner, upon applying the voltage to the piezoelectric vibrator 1, the piezoelectric vibrating piece 4 in the piezoelectric vibrator 1 is vibrated. The vibration is converted to the electric signal by the piezoelectric characteristic of the piezoelectric vibrating piece 4 and is input to the integrated circuit 101 as the electric signal. The input electric signal is subjected to various processes by the integrated circuit 101 and is output as the frequency signal. As a result, the piezoelectric vibrator 1 functions as the oscillating element.

Furthermore, by selectively setting the configuration of the integrated circuit 101, for example, a RTC (Real Time Clock) module or the like depending on demand, it is possible to add a function of controlling the operation date or time of the device or external device other than a single-function oscillator for the timepiece or the like, or providing a time, a calendar or the like.

As mentioned above, according to the oscillator 100 of the present embodiment, since the piezoelectric vibrator 1 mentioned above is included, it is possible to provide the oscillator 100 of high quality having excellent characteristics and reliability. Furthermore, in addition to this, it is possible to obtain a high precision frequency signal that is stable for a long period of time.

(Electronic Apparatus)

Figure 12:
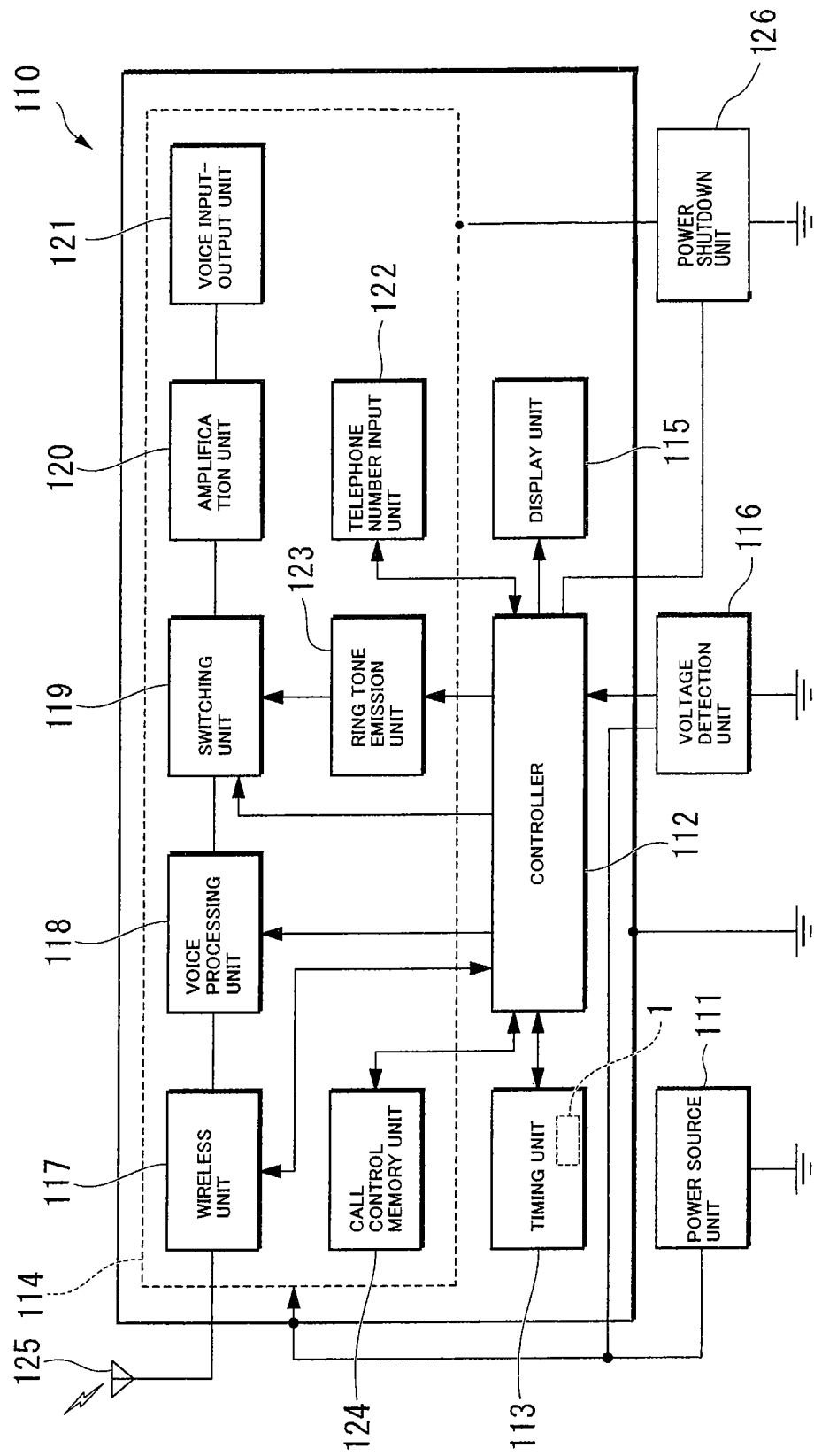
FIG. 12 is a schematic configuration diagram of a portable information device in the embodiment of the present invention.

Next, an embodiment of the electronic apparatus according to the aspects of the present invention will be described with reference to FIG. 12. Furthermore, as the electronic apparatus, a portable information device 110 having the piezoelectric vibrator 1 will be described as an example. Firstly, the portable information device 110 of the present embodiment is represented by, for example, a mobile phone, and is a device that develops and improves a wristwatch in the related art. An exterior thereof is similar to the wristwatch, a liquid crystal display is disposed in a portion corresponding to a text plate, and a current time or the like can be displayed on the screen. Furthermore, in the case of being used as a communicator, the device is removed from the wrist, and the communication like the mobile phone of the related art can be performed by a speaker and a microphone equipped in the inner portion of the band. However, the device is considerably reduced in size and weight compared to the mobile phone of the related art.

(Portable Information Device)

Next, a configuration of portable information device 110 of the present embodiment will be described. As shown in FIG. 12, the portable information device 110 includes the piezoelectric vibrator 1 and a power source portion 111 for supplying the electric power. For example, the power source portion 111 is formed of a lithium secondary battery. A control portion 112 performing various controls, counter portions 113 performing the count such as the time, a communication portion 114 performing the communication with the outside, a display portion 115 displaying various pieces of information, and a voltage detection portion 116 detecting the voltage of the respective function portions are connected to the power source portion 111 in parallel. Moreover, the electric power is supplied to the respective function portions by the power source portion 111.

The control portion 112 controls the respective function portions, and performs the operation control of the whole system such as reception and the transmission of the sound data, measurement and display of the current time or the like. Furthermore, the control portion 112 includes a ROM with a program written in advance therein, a CPU reading and executing the program written in the ROM, a RAM used as a work area of the CPU or the like.

The counter portion 113 includes an integrated circuit equipped with an oscillation circuit, a register circuit, a counter circuit, an interface circuit or the like, and the piezoelectric vibrator 1. When applying the voltage to the piezoelectric vibrator 1, the piezoelectric vibrating piece 4 is vibrated, and the vibration is converted into the electric signal by the piezoelectric characteristic of crystal and is input to the oscillation circuit as the electric signal. The output of the oscillation circuit is binarized and is counted by the register circuit and the counter circuit. Moreover, the signal is received and transmitted together with the control portion 112 via the interface circuit, and the current time, the current date, the calendar information or the like are displayed on the display portion 115.

The communication portion 114 has the same function as the mobile phone of the related art, and includes a wireless portion 117, a sound processing portion 118, a switching portion 119, an amplification portion 120, a sound input and output portion 121, a phone number input portion 122, a ringtone generating portion 123, and a call control memory portion 124.

The wireless portion 117 exchanges the transmission and the reception of various data such as the sound data with a base station via an antenna 125. The sound processing portion 118 encodes and decodes the sound signal that is input from the wireless portion 117 or the amplification portion 120. The amplification portion 120 amplifies the signal input from the sound processing portion 118 or the sound input and output portion 121 up to a predetermined level. The sound input and output portion 121 is constituted by a speaker, a microphone or the like, amplifies the ringtone or the received sound or collects the sound.

Furthermore, the ringtone generating portion 123 creates the ringtone depending on the call from the base station. The switching portion 119 switches the amplification portion 120 connected to the sound processing portion 118 into the ringtone generating portion 123 only at the time of the reception, whereby the ringtone created in the ringtone generating portion 123 is output to the sound input and output portion 121 via the amplification portion 120.

In addition, the call control memory portion 124 stores the program relating to the call arrival and departure control of the communication. Furthermore, the phone number input portion 122 includes, for example, number keys from 0 to 9, and other keys, and a phone number or the like of a communication target is input by pressing the number keys or the like.

When the voltage added to the respective function portions such as the control portion 112 by the power source portion 111 is lower than a predetermined value, the voltage detection portion 116 detects the voltage drop and notifies the same to the control portion 112. The predetermined voltage value of this time is a value which is set as a minimum voltage required for stably operating the communication portion 114 in advance, and, for example, is about 3 V. The control portion 112 received the notification of the voltage drop from the voltage detection portion 116 prevents the operation of the wireless portion 117, the sound processing portion 118, the switching portion 119, and the ringtone generating portion 123. Particularly, the stopping of the operation of the wireless portion 117 which has high power consumption is essential. In addition, an indication is displayed on the display portion 115 in which the communication portion 114 is unusable from the shortage of the battery residual amount.

That is, the operation of the communication portion 114 is prohibited by the voltage detection portion 116 and the control portion 112, and the indication thereof can be displayed on the display portion 115. The display may be a text message, but an X (false) mark may be displayed on a phone icon displayed on the upper portion of the display surface of the display portion 115 as a more intuitive display.

In addition, a power source blocking portion 126 capable of selectively blocking the power source of a portion relating to the function of the communication portion 114 is included, whereby the function of the communication portion 114 can be further reliably stopped.

As mentioned above, according to the portable information device 110 of the present embodiment, since the piezoelectric vibrator 1 mentioned above is included, it is possible to provide the portable information device 110 of high quality having excellent characteristics and reliability. Furthermore, in addition to this, it is possible to display high precision timepiece information that is stable for a long period of time.

(Radio Timepiece)

Next, an embodiment of a radio timepiece according to the aspects of the present invention will be described with reference to FIG. 13.

Figure 13:
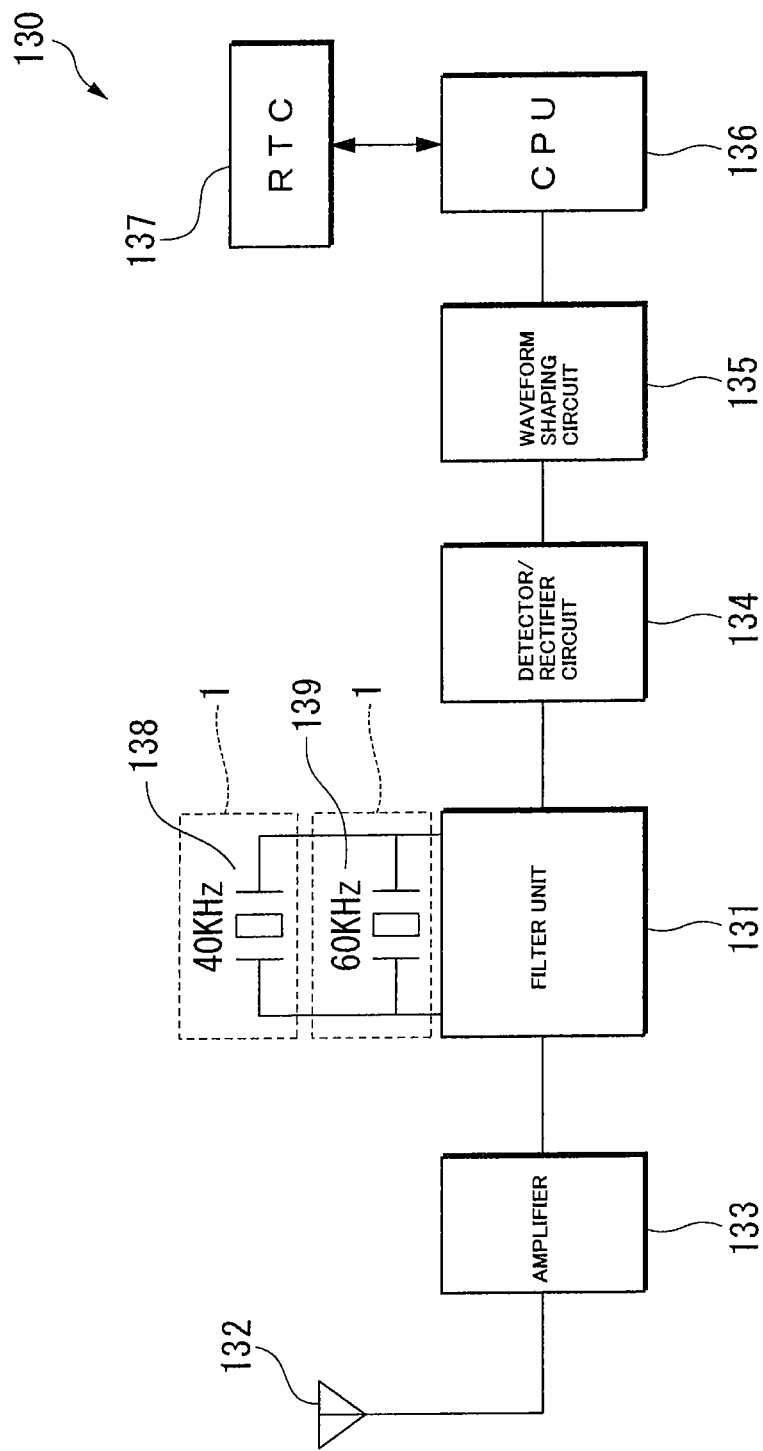
FIG. 13 is a schematic configuration diagram of a radio timepiece in the embodiment of the present invention.

As shown in FIG. 13, the radio timepiece 130 of the present embodiment includes the piezoelectric vibrator 1 electrically connected to a filter portion 131, and is a timepiece that has a function of receiving standard radio waves including the clock information and automatically correcting and displaying the same at a correct time.

In Japan, in Fukushima Prefecture (40 kHz) and Saga Prefecture (60 kHz), there are transmission stations (transmission departments) transmitting the standard radio waves, and transmit the standard radio waves, respectively. Since long wave such as 40 kHz or 60 kHz together have the property of being propagated along the surface of the earth and the property of propagating while being reflected between the ionization layer and the surface of the Earth, the propagation range is wide, and the two transmission stations cover all of Japan.

Hereinafter, a functional configuration of the radio timepiece 130 will be specifically described.

The antenna 132 receives the standard radio wave having a 40 kHz or 60 kHz long wave. An AM modulation of the standard long wave radio waves is performed on the 40 kHz or 60 KHz carrier wave, to provide the time information called a time code. The received standard radio waves of the long wave are amplified by an amplifier 133, and are filtered and tuned by a filter portion 131 having a plurality of piezoelectric vibrators 1.

The piezoelectric vibrators 1 in the present embodiment include crystal vibrator portions 138 and 139 having the same resonance frequency of 40 kHz and 60 kHz as the carrier frequency mentioned above, respectively.

In addition, the filtered signal of a predetermined frequency is detected and demodulated by a detection and rectifier circuit 134. Next, the time code is extracted via a waveform shaping circuit 135 and is counted by the CPU 136. In the CPU 136, information such as the current year, cumulative date, day of week, and time are read. The read information is reflected in the RTC 137 and the correct time information is displayed.

Since the carrier wave is 40 kHz or 60 kHz, a vibrator having the tuning fork-like structure mentioned above is preferable as the crystal vibration portions 138 and 139.

In addition, the description mentioned above illustrated the example of Japan, but the frequency of the standard radio waves of the long wave differs abroad. For example, standard radio waves of 77.5 kHz are used in Germany. Thus, when the radio timepiece 130 capable of support abroad as well is built in the portable device, there is a need for the piezoelectric vibrator 1 having a frequency which differs from the case of Japan.

As mentioned above, according to the radio timepiece 130 of the present embodiment, since it includes the piezoelectric vibrator 1, it is possible to provide a radio timepiece 130 of high quality having excellent characteristics and reliability. Furthermore, in addition to this, it is possible to stably and accurately count the time for a long period of time.

In addition, the technical scope of the present invention is not limited to the embodiment mentioned above, and various modifications can be added within the scope not departing from the gist of the present invention.

For example, in the embodiment mentioned above, a case was described where the weight metal film 21 is formed to avoid the avoidance region R by the patterning in the weight metal film forming process (S160). However, after forming the weight metal film 21 at the tip portion including the avoidance region R in the vibration arm portions 10 and 11, the weight metal film 21 (the rough adjustment film 21a) of the avoidance region R may be removed by the laser irradiation in the rough adjustment process, without being limited thereto. In this case, by setting the length of the avoidance region R in the longitudinal direction to be greater than the position accuracy of the laser light, when removing the weight metal film 21 of the avoidance region R, the weight metal film 21 of the avoidance region R can be reliably removed regardless of the position accuracy of the laser device. As a consequence, as mentioned above, the peeling of the weight metal film 21 is prevented, and it is possible to provide the piezoelectric vibrator 1 of high quality having excellent vibration characteristics.

What is claimed is:

1. A piezoelectric vibrating piece comprising:
   a base portion;
   a pair of vibration arm portions extending from the base portion and adjacent to one another in a width direction,
   the pair of vibrating arm portions having proximal ends connected to the base portion and distal ends away from the base portion in an extending direction; and
   weight metal films on outer surfaces of the vibration arm portions,
   wherein the weight metal films avoid the distal ends of the vibration arm portions, such that the distal ends are free of metal,
   the weight metal films comprise a first rough frequency adjustment metal film and a second minute frequency adjustment metal film adjacent to the first rough frequency adjustment metal film, and
   the first rough frequency adjustment metal film has a thickness greater than that of the second minute frequency adjustment metal film.

2. The piezoelectric vibrating piece according to claim 1, wherein the weight metal films have a varying thickness through partial removal by laser irradiation, whereby frequencies of the vibration piece is adjusted so as have object frequencies, and
   lengths of the distal ends in the extending direction are greater than an error in the partial removal by laser irradiation.

3. A piezoelectric vibrator comprising the piezoelectric vibrating piece according to claim 1 hermetically sealed in a package.

4. An oscillator comprising the piezoelectric vibrator according to claim 3 electrically connected to an integrated circuit as an oscillating element.

5. An electronic apparatus comprising the piezoelectric vibrator according to claim 3 electrically connected to a counter portion.

6. A radio timepiece comprising the piezoelectric vibrator according to claim 3 electrically connected to a filter portion.

7. The piezoelectric vibrating piece according to claim 1, wherein the a first rough frequency adjustment metal film resides proximal to the distal ends and the second minute frequency adjustment metal film resides proximal to the base portion.

8. The piezoelectric vibrating piece according to claim 1, wherein the first rough frequency adjustment metal film comprises at least two overlying metal films and the second minute frequency adjustment metal film comprises a single metal film.

* * * * *